(12) United States Patent
Lim et al.

(10) Patent No.: US 12,207,522 B2
(45) Date of Patent: Jan. 21, 2025

(54) DISPLAY APPARATUS AND METHOD OF MANUFACTURING THE SAME INCLUDING CUTTING SUBSTRATE AND BLACK MATRIX AT TIP END OF BLOCKING LAYER

(71) Applicant: SAMSUNG DISPLAY CO., LTD., Yongin-si (KR)

(72) Inventors: Tae Woo Lim, Yongin-si (KR); Bon-Yong Koo, Yongin-si (KR); Hyungjune Kim, Yongin-si (KR); Eunje Jang, Yongin-si (KR); Jang-Bog Ju, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/395,414

(22) Filed: Dec. 22, 2023

(65) Prior Publication Data
US 2024/0130192 A1 Apr. 18, 2024

Related U.S. Application Data

(62) Division of application No. 17/365,426, filed on Jul. 1, 2021, now Pat. No. 11,856,803.

(30) Foreign Application Priority Data

Sep. 17, 2020 (KR) .......................... 10-2020-0120019

(51) Int. Cl.
*H10K 59/38* (2023.01)
*H01L 27/15* (2006.01)
(Continued)

(52) U.S. Cl.
CPC ........... *H10K 59/38* (2023.02); *H01L 27/156* (2013.01); *H01L 33/08* (2013.01);
(Continued)

(58) Field of Classification Search
CPC .. H10K 59/1213; H10K 59/124; H10K 59/38; H10K 71/00; H10K 71/40;
(Continued)

(56) References Cited

U.S. PATENT DOCUMENTS 7,961,277 B2 * 6/2011 Yeh ....................... G02F 1/1339
349/111
8,269,926 B2 9/2012 Yeh et al.
(Continued)

*Primary Examiner* — Matthew E. Gordon
(74) *Attorney, Agent, or Firm* — Lewis Roca Rothgerber Christie LLP

(57) ABSTRACT

A display apparatus includes: a substrate; a pixel circuit layer on the substrate and including a thin-film transistor; a display element layer on the pixel circuit layer and including a display element electrically connected to the thin-film transistor; a color filter layer on the display element layer and including a color filter overlapping the display element and a black matrix having a first side contacting the color filter and a second side extending in an edge direction of the substrate; and a blocking layer between the black matrix and the substrate, wherein a tip end of the blocking layer has no step difference with an end of the black matrix.

11 Claims, 14 Drawing Sheets

(51) Int. Cl.
*H01L 33/08* (2010.01)
*H10K 59/121* (2023.01)
*H10K 59/124* (2023.01)
*H10K 71/00* (2023.01)

(52) U.S. Cl.
CPC ....... *H10K 59/1213* (2023.02); *H10K 59/124* (2023.02); *H10K 71/00* (2023.02)

(58) Field of Classification Search
CPC .. H10K 71/421; H10K 71/441; H01L 27/156; H01L 33/08
USPC .......................................................... 257/72
See application file for complete search history.

(56) References Cited

U.S. PATENT DOCUMENTS

| | | | | |
|---|---|---|---|---|
| 9,508,783 | B2* | 11/2016 | Jiang | H10K 59/131 |
| 2004/0114089 | A1* | 6/2004 | Do | G02F 1/133351 |
| | | | | 349/110 |
| 2007/0012925 | A1* | 1/2007 | Hong | G02F 1/1362 |
| | | | | 257/72 |

* cited by examiner

DISPLAY APPARATUS AND METHOD OF MANUFACTURING THE SAME INCLUDING CUTTING SUBSTRATE AND BLACK MATRIX AT TIP END OF BLOCKING LAYER

CROSS-REFERENCE TO RELATED APPLICATIONS

This application is a divisional of U.S. patent application Ser. No. 17/365,426, filed Jul. 1, 2021, which claims priority to and the benefit of Korean Patent Application No. 10-2020-0120019, filed Sep. 17, 2020, the entire content of both of which is incorporated herein by reference.

BACKGROUND

1. Field

Aspects of one or more embodiments relate to a display apparatus and a method of manufacturing the same.

2. Description of Related Art

A display apparatus is an apparatus visually displaying data. The display apparatus may be used as a display of a small-sized product such as a cellular phone, etc. or a display of a large-sized product such as a television, etc.

Recently, with the diversified usage of the display apparatus, various attempts have been made to develop designs to improve the quality of the display apparatus. For example, with the size of the display apparatus getting larger, methods of minimizing an area of a non-display area of the display apparatus have been actively studied.

For efficiency of a manufacturing process, a display apparatus may be manufactured by using a manufacturing method, which includes forming a plurality of display panels for a plurality of cell areas on a mother substrate and cutting each cell area.

The above information disclosed in this Background section is only for enhancement of understanding of the background and therefore the information discussed in this Background section does not necessarily constitute prior art.

SUMMARY

Aspects of one or more embodiments relate to a display apparatus and a method of manufacturing the same, and for example, to a display apparatus in which an area of a non-display area is minimized or relatively reduced to improve display quality, and a method of manufacturing the display apparatus.

In a display apparatus and a method of manufacturing the same according to the related art, during a cutting process, components located in an area adjacent to a cutting line may be damaged and a non-display area may be increased, and thus, the display quality may deteriorate.

Aspects of some embodiments of the present disclosure may include a display apparatus for improving the display quality by minimizing or reducing an area of a non-display area, and a method of manufacturing the display apparatus. However, these characteristics are examples and do not limit the scope of embodiments according to the present disclosure.

Additional aspects will be set forth in part in the description which follows and, in part, will be more apparent from the description, or may be learned by practice of the presented embodiments of the disclosure.

According to one or more embodiments, a display apparatus includes a substrate, a pixel circuit layer on the substrate, the pixel circuit layer including a thin-film transistor, a display element layer on the pixel circuit layer, the display element layer including a display element electrically connected to the thin-film transistor, a color filter layer on the display element layer, the color filter layer including a color filter overlapping the display element and a black matrix having a side contacting the color filter and another side extending in an edge direction of the substrate, and a blocking layer between the black matrix and the substrate, wherein a tip end of the blocking layer has no step difference with an end of the black matrix.

According to some embodiments, the display apparatus may further include a bottom metal layer between a semiconductor layer of the thin-film transistor and the substrate, and the blocking layer and the bottom metal layer may include a same material.

According to some embodiments, the blocking layer and a gate electrode of the thin-film transistor or the blocking layer and a source electrode of the thin-film transistor may include a same material.

According to some embodiments, the blocking layer may include a first layer and a second layer on the first layer.

According to some embodiments, the display apparatus may further include a bottom metal layer between a semiconductor layer of the thin-film transistor and the substrate. Also, the first layer and the bottom metal layer may include a same material, and the second layer and a gate electrode of the thin-film transistor or the second layer and a source electrode of the thin-film transistor may include a same material.

According to some embodiments, the first layer and a gate electrode of the thin-film transistor may include a same material, and the second layer and a source electrode of the thin-film transistor may include a same material.

According to some embodiments, an upper surface of the first layer may contact a lower surface of the second layer.

According to some embodiments, at least one insulating layer may be arranged between the first layer and the second layer, and the at least one insulating layer may have at least one contact hole connecting the first layer with the second layer.

According to some embodiments, the blocking layer may extend along at least one edge of the substrate, and the tip end of the blocking layer may have no step difference with the at least one edge of the substrate.

According to some embodiments, a thermal conductivity of the blocking layer may be greater than a thermal conductivity of the black matrix.

According to some embodiments, the display apparatus may further include a quantum dot layer on the color filter layer.

According to one or more embodiments, a method of manufacturing a display apparatus includes forming, on a substrate, a bottom metal layer a pixel circuit layer including a thin-film transistor having a semiconductor layer overlapping the bottom metal layer, and a blocking layer, forming, on the pixel circuit layer, a display element layer including a display element electrically connected to the thin-film transistor, forming, on the display element layer, a color filter layer including a color filter overlapping the display element and a black matrix having a side contacting the color filter and another side extending in an edge direction of the substrate, and cutting the substrate and the black matrix based on a tip end of the blocking layer, the tip end being at the other side of the black matrix.

According to some embodiments, the blocking layer may be simultaneously (or concurrently) formed with the bottom metal layer, and the blocking layer and the bottom metal layer may include a same material.

According to some embodiments, the blocking layer may be simultaneously (or concurrently) formed with a gate electrode or a source electrode of the thin-film transistor, and the blocking layer and the gate electrode or the blocking layer and the source electrode may include a same material.

According to some embodiments, the forming of the blocking layer may include forming a first layer, and forming a second layer on the first layer.

According to some embodiments, the first layer may be simultaneously (or concurrently) formed with the bottom metal layer, and the first layer and the bottom metal layer may include a same material, and the second layer may be simultaneously (or concurrently) formed with a gate electrode or a source electrode of the thin-film transistor, and the second layer and the gate electrode or the second layer and the source electrode may include a same material.

According to some embodiments, an upper surface of the first layer may contact a lower surface of the second layer.

According to some embodiments, at least one insulating layer may be arranged between the first layer and the second layer, and the at least one insulating layer may have at least one contact hole connecting the first layer with the second layer.

According to some embodiments, a thermal conductivity of the blocking layer may be greater than a thermal conductivity of the black matrix.

According to some embodiments, the method may further include forming a quantum dot layer on the color filter layer.

These general and specific embodiments may be implemented by using a system, a method, a computer program, or a combination of the system, the method, and the computer program.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
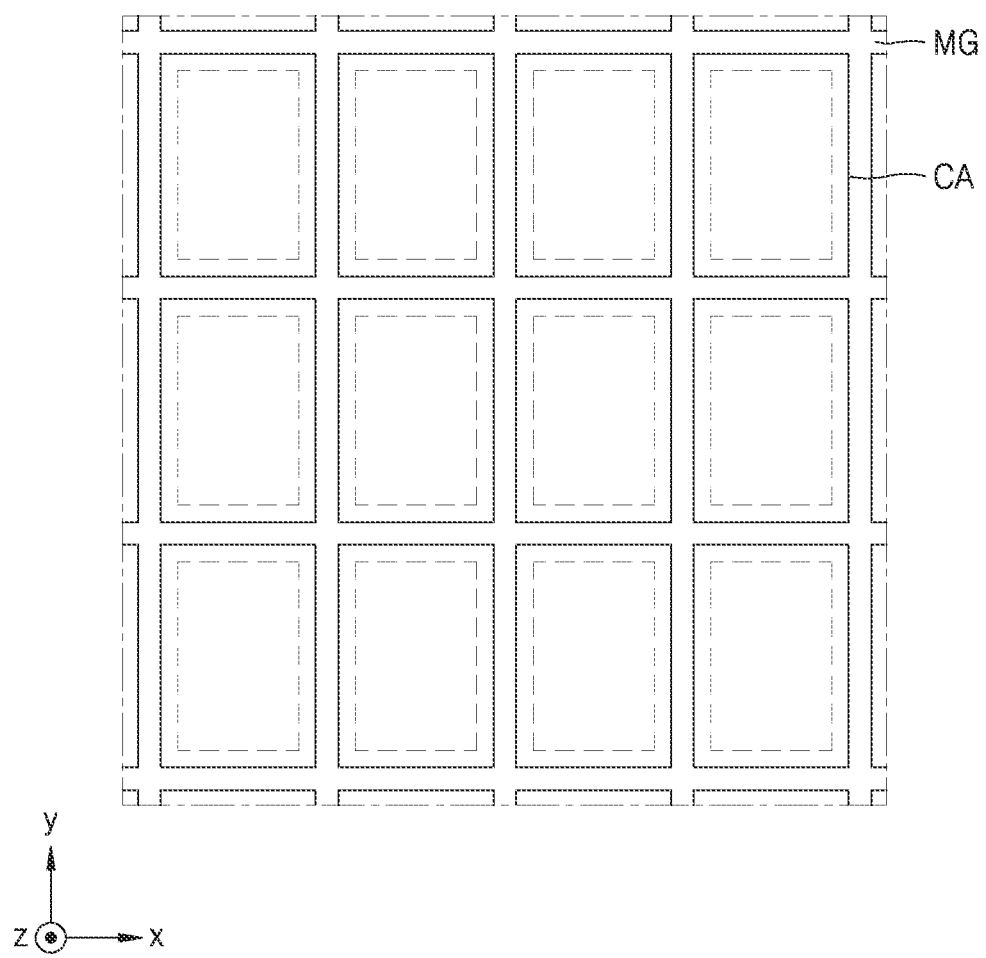
FIG. 1 is a schematic plan view of a portion of a mother substrate according to some embodiments.

Reference will now be made in more detail to aspects of some example embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

While the disclosure is capable of various modifications and alternative forms, embodiments thereof are shown by way of example in the drawings and will herein be described in more detail. Effects and characteristics of the disclosure, and realizing methods thereof will become apparent by referring to the drawings and embodiments described in more detail below. However, embodiments according to the present disclosure are not limited to the embodiments disclosed hereinafter and may be realized in various forms.

Hereinafter, embodiments of the disclosure will be described in more detail by referring to the accompanying drawings. In descriptions with reference to the drawings, the same reference numerals are given to components that are the same or substantially the same and descriptions will not be repeated.

It will be understood that although the terms "first," "second," etc. may be used herein to describe various components, these components should not be limited by these terms. These components are only used to distinguish one component from another.

As used herein, the singular expressions "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is referred to as being formed "on" another layer, area, or element, it can be directly or indirectly formed on the other layer, region, or element. That is, for example, intervening layers, regions, or elements may be present.

Sizes of elements in the drawings may be exaggerated for convenience of explanation. For example, sizes and thicknesses of the elements in the drawings are randomly indicated for convenience of explanation, and thus, the disclosure is not necessarily limited to the illustrations of the drawings.

When a certain embodiment may be implemented differently, a specific process order may be performed differently from the described order. For example, two consecutively described processes may be performed substantially at the same time or performed in an order opposite to the described order.

In this specification, the expression "A and/or B" may indicate A, B, or A and B. Also, the expression "at least one of A and B" may indicate A, B, or A and B.

In the embodiments hereinafter, it will be understood that when an element, an area, or a layer is referred to as being connected to another element, area, or layer, it can be directly and/or indirectly connected to the other element, area, or layer. For example, it will be understood in this specification that when an element, an area, or a layer is referred to as being in contact with or being electrically connected to another element, area, or layer, it can be directly and/or indirectly in contact with or electrically connected to the other element, area, or layer.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Hereinafter, embodiments will be described in more detail with reference to the accompanying drawings.

FIG. 1 is a schematic plan view of a portion of a mother substrate MG according to some embodiments.

As illustrated in FIG. 1, the mother substrate MG according to some embodiments may include a plurality of cell areas CA. For example, the mother substrate MG may include substrates 100 (see FIG. 2) located in the plurality of cell areas CA, respectively.

The mother substrate MG may be prepared for manufacturing a display apparatus 1 (see FIG. 2), and each of the plurality of cell areas CA may correspond to a display panel included in the display apparatus. Here, the display apparatus may be an apparatus for displaying a video or a static image and may be used as a display screen of various products including not only portable electronic devices, such as a mobile phone, a smart phone, a tablet personal computer (PC), a mobile communication terminal, an electronic notebook, an electronic book, a portable multimedia player (PMP), a navigation device, and a ultra mode PC (UMPC), but also other devices, such as a television, a notebook computer, a monitor, a broadcasting panel, and an Internet of things (IOT) device. Also, according to some embodiments, the display apparatus may have a tile structure in which a plurality of display panels are connected to collectively realize or form a large screen.

FIG. 1 illustrates that the mother substrate MG have the plurality of cell areas CA for manufacturing a flat display apparatus having a flat shape. However, a display apparatus manufactured based on the mother substrate MG according to some embodiments may include a flexible display apparatus, which has the flexible characteristics to be bendable, foldable, or rollable. For example, the display apparatus may include a foldable display apparatus, which may be folded or unfolded, a curved display apparatus having a curved display surface, a bent display apparatus, in which areas except for a display surface are bent, a rollable display apparatus, which may be rolled or unrolled, and a stretchable display apparatus, which may be stretched.

According to some embodiments, the plurality of cell areas CA may be arranged on the mother substrate MG in a first direction (for example, an x direction) and/or a second direction (for example, a y direction), which crosses the first direction. FIG. 1 illustrates a case in which the first direction and the second direction are orthogonal with respect to each other. However, the first and second directions are not limited thereto. For example, the first and second directions may form an acute angle or an obtuse angle.

According to some embodiments, as illustrated in FIG. 1, sizes of the plurality of cell areas CA may be the same as one another on a plane (for example, an x-y plane). However, the plurality of cell areas CA are not limited thereto, and a planar size of at least one cell area of the plurality of cell areas CA may be different from planar sizes of the other cell areas CA.

A plurality of processes may be performed on the mother substrate MG to form devices corresponding to the plurality of cell areas CA, respectively. Then, a cutting process for dividing each cell area CA may be performed to manufacture a plurality of display panels. Also, additional post-treatment processes, such as a polishing process, a cleaning process, etc., may be performed on each of the display panel that is cut.

Figure 2:
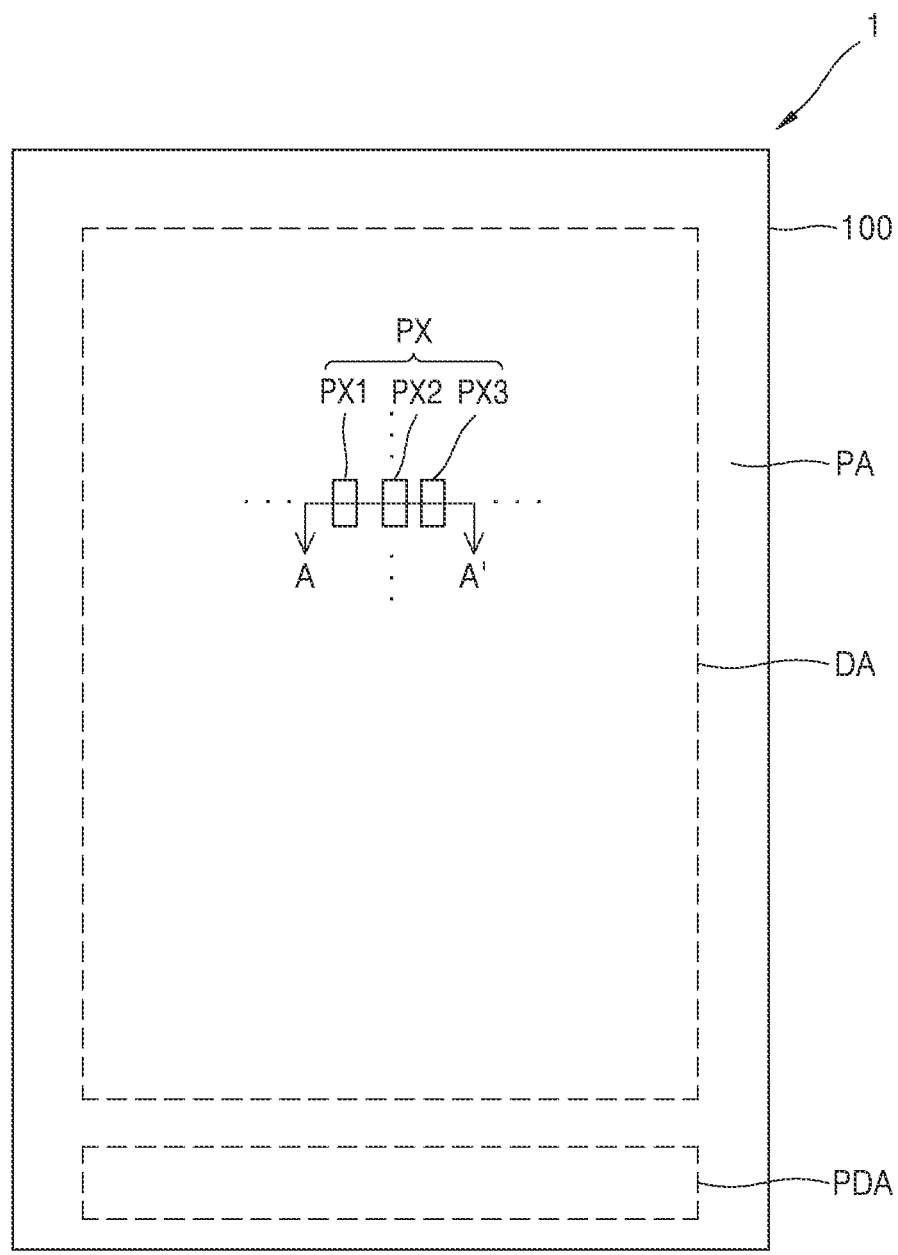
FIG. 2 is a schematic plan view of a portion of a display apparatus according to some embodiments.

FIG. 2 is a schematic plan view of a portion of the display apparatus 1 according to some embodiments.

FIG. 2 may be understood as illustrating a display panel, which is included in the display apparatus 1, and which is divided by performing a cutting process on the mother substrate MG of FIG. 1.

Also, FIG. 2 illustrates a case in which each of the display apparatus 1 and a display area DA has a rectangular shape having short sides in a first direction (an x direction) and long sides in a second direction (a y direction) in a planar view. However, the display apparatus 1 and the display area DA are not limited thereto. In other words, the display apparatus 1 and/or the display area DA may have the rectangular shape having the short sides in the first direction (the x direction) and the long sides in the second direction (the y direction), may have a shape including round edges having a curvature (e.g., a set or predetermined curvature), the round edges corresponding to a region where short sides and long sides cross each other, or may have a shape including right-angled edges, which are crossing points of short sides and long sides. Also, the display apparatus 1 and/or the display area DA may have other polygonal shapes, an oval shape, or an amorphous shape.

As illustrated in FIG. 2, the display apparatus 1 according to some embodiments may have a display area DA emitting light and a peripheral area PA not emitting light. That is, the peripheral area PA may be an area located in a periphery (e.g., outside a footprint) of the display area DA. The substrate 100 may include a first area corresponding to the display area DA and a second area corresponding to the peripheral area PA.

Pixels PX may be located in the display area DA. The pixels PX may include a pixel circuit and a display element electrically connected to the pixel circuit. The display apparatus 1 may provide an image by using light emitted from the pixels PX.

The peripheral area PA may surround at least a portion of the display area DA. For example, the peripheral area PA may generally surround the display area DA. Various interconnection lines for transmitting electrical signals that are to be applied to the display area DA may be located in the peripheral area PA. Also, a portion of a circuit portion configured to control the electrical signals to be applied to the display area DA may be located in the peripheral area PA.

A pad area PAD may be located on at least one side of the peripheral area PA. A pad portion including a plurality of pads may be arranged on the pad area PDA. Each of the plurality of pads of the pad portion may be electrically connected to each of pads of a printed circuit board to receive a signal that is input through the printed circuit board. To this end, the pad portion may include the plurality of pads. The plurality of pads may not be covered by an insulating layer. Rather, the plurality of pads may be exposed and may be electrically connected to the printed circuit board, etc.

According to some embodiments, the display apparatus 1 may include a component located on a side of the display apparatus 1. The component may include an electronic element using light or sound. For example, the electronic element may include a sensor configured to receive and use light, such as an infrared sensor, a camera configured to receive light and capture an image, a sensor configured to measure a distance or recognize a fingerprint, etc. by outputting and sensing light or sound, a small lamp configured to output light, a speaker configured to output sound, etc.

Figure 3:
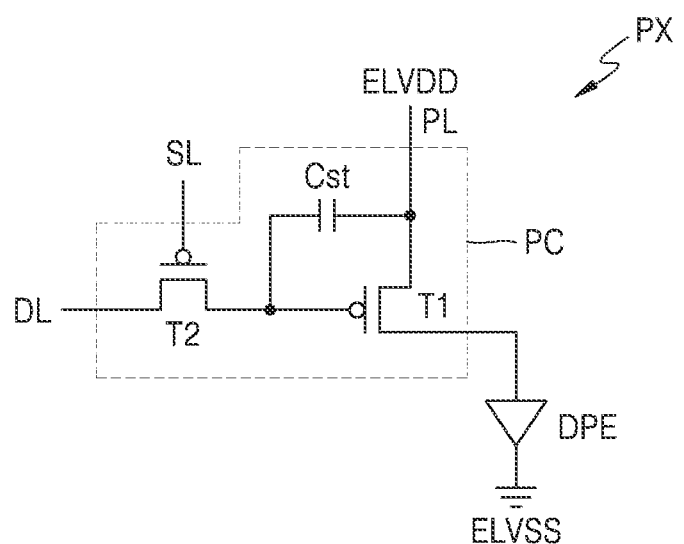
FIG. 3 is a schematic equivalent circuit diagram of a pixel included in a display apparatus according to some embodiments.

FIG. 3 is a schematic equivalent circuit diagram of each of pixels PX included in a display apparatus according to some embodiments.

Referring to FIG. 3, each pixel PX may be electrically connected to a pixel circuit PC. The pixel circuit PC may include a first thin-film transistor T1, a second thin-film transistor T2, and a storage capacitor Cst. Each pixel PX may emit light through a display element DPE. For example, each pixel PX may emit red, green, blue, or white light.

The second thin film transistor T2 may include a switching thin film transistor, may be connected to a scan line SL and a data line DL, and may be configured to transmit, to the first thin film transistor T1, a data voltage provided from the data line DL, based on a switching voltage provided from the scan line SL. The storage capacitor Cst may be connected to the second thin film transistor T2 and a driving voltage line PL and may store a voltage corresponding to a difference between a voltage received from the second thin film transistor T2 and a first power voltage ELVDD supplied to the driving voltage line PL.

The first thin film transistor T1 may include a driving thin film transistor and may be connected to the driving voltage line PL and the storage capacitor Cst. Also, the first thin film transistor T1 may be configured to control a driving current flowing from the driving voltage line PL through the display device DPE, in correspondence with a voltage value stored in the storage capacitor Cst. The display element DPE may emit light having a certain brightness, based on the driving current. An opposite electrode (for example, a cathode) of the display element DPE may receive a second power voltage ELVSS.

In FIG. 3, it is described that the pixel circuit PC includes two thin-film transistors and one capacitor. However, the pixel circuit PC is not limited thereto. That is, the number of thin-film transistors and the number of capacitors included in the pixel circuit PC may be variously modified according to a design of the pixel circuit PC. For example, the pixel circuit PC may include two thin-film transistors, as described above, or the pixel circuit PC may include four thin-film transistors, five thin-film transistors, or more than five thin-film transistors. Also, the pixel circuit PC may further include one or more capacitors in addition to the storage capacitor Cst described above. Thus, embodiments according to the present disclosure are not limited to the number of elements illustrated in FIG. 3, and the pixel circuit PC may include additional electrical components, or fewer electrical components, without departing from the spirit and scope of embodiments according to the present disclosure.

Figure 4:
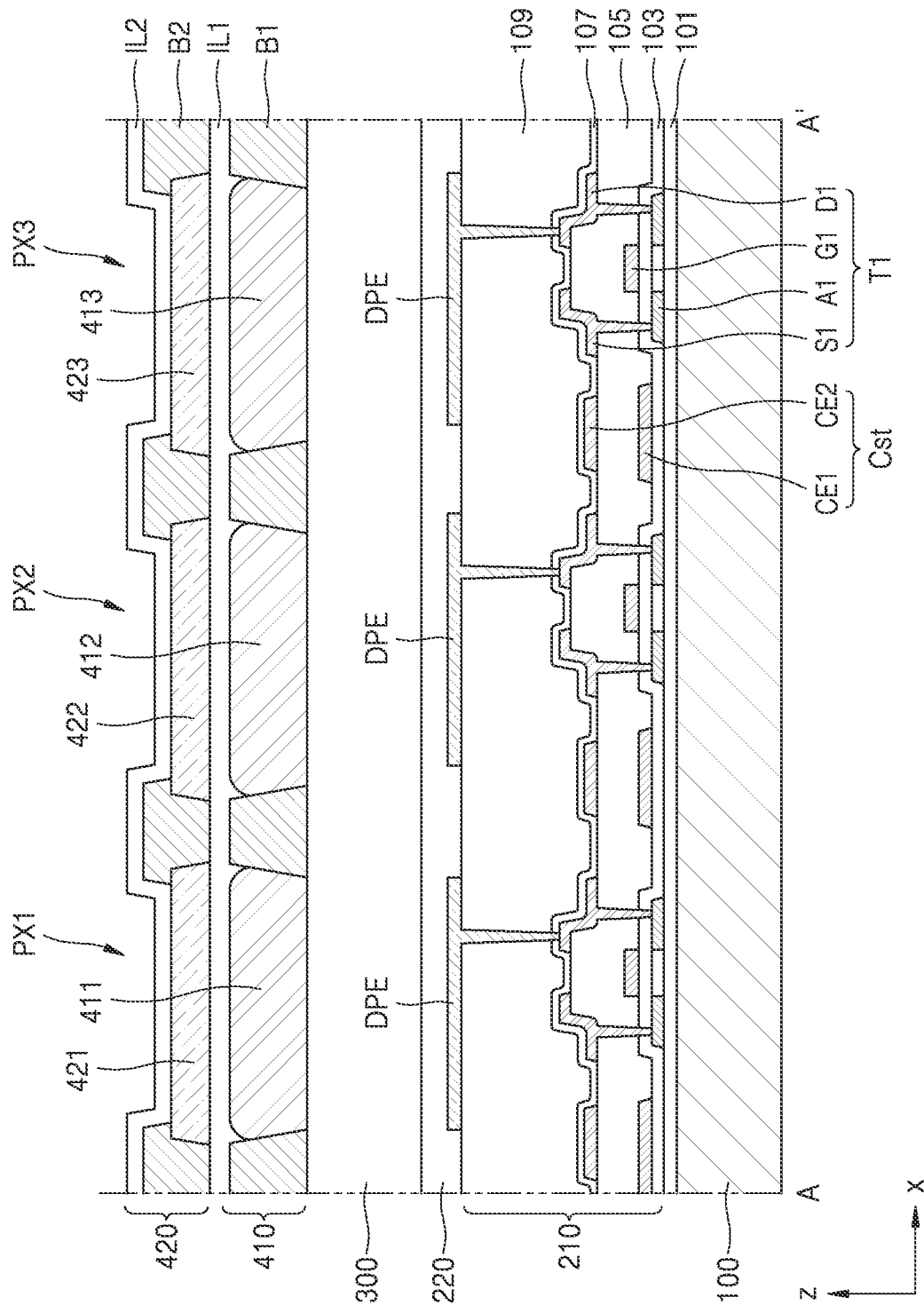
FIG. 4 is a schematic cross-sectional view of a portion of a display apparatus according to some embodiments.

FIG. 4 is a schematic cross-sectional view of a portion of the display apparatus 1 according to some embodiments. FIG. 4 corresponds to a cross-sectional view of the display apparatus 1 of FIG. 2, taken along the line A-A'.

FIGS. 2 and 4 illustrate that a first pixel PX1 through a third pixel PX3 are adjacent to one another. However, the first through third pixels PX1 through PX3 are not limited thereto. For example, other components, such as interconnection lines, etc., may be arranged between the first through third pixels PX1 through PX3. Also, the first and second pixels PX1 and PX2 may not be adjacent to each other. Also, cross-sections of the first through third pixels PX1 through PX3 in FIG. 4 may not be the cross-sections in the same direction.

As illustrated in FIG. 4, the display apparatus 1 according to some embodiments may include the substrate 100, a pixel circuit layer 210, a display element layer 220, an encapsulation layer 300, a quantum dot layer 410, and a color filter layer 420.

The substrate 100 may include glass, metal, or polymer resins. In the case where the substrate 100 has a flexible or bendable property, the substrate 100 may include polymer resins, such as polyethersulphone, polyacrylate, polyetherimide, polyethylene naphthalate, polyethylene terephthalate, polyphenylene sulfide, polyarylate, polyimide, polycarbonate, or cellulose acetate propionate. However, various modifications may be possible. For example, the substrate 100 may have a multi-layered structure including: two layers each including the polymer resins described above; and a barrier layer between the two layers, the barrier layer including an inorganic material (such as silicon oxide, silicon nitride, silicon oxynitride, or the like).

A buffer layer 101 may be located on the substrate 100.

The buffer layer 101 may include an inorganic material, such as silicon oxide, silicon nitride, and/or silicon oxynitride, and may include a single layer or multiple layers. Also, the buffer layer 101 may extend onto the display area and the non-display area. The buffer layer 101 may increase planarization of an upper surface of the substrate 100 or prevent, reduce, or minimize penetration of impurities or moisture from the outside of the substrate 100, etc. into a semiconductor layer.

According to some embodiments, a bottom metal layer 102 (see FIG. 7) may be located on the substrate 100. Here, the buffer layer 101 may cover the bottom metal layer 102 and may be located on the substrate 100. The bottom metal layer 102 may overlap at least a portion of the semiconductor layer of a thin-film transistor. Based on this structure, the bottom metal layer 102 may protect the semiconductor layer from external light. The bottom metal layer 102 may include Al, Pt, Pd, Ag, Mg, Au, Ni, Nd, Ir, Cr, Ca, Mo, Ti, W, and/or Cu. Also, the bottom metal layer 102 may include a single layer or multiple layers including the materials described above.

The pixel circuit layer 210 may be located on the buffer layer 101.

The pixel circuit layer 210 may include the pixel circuit PC (see FIG. 3). Each of the pixel circuits PC may be electrically connected to the first pixel PX1, the second pixel PX2, or the third pixel PX3. A thin-film transistor included in each of the pixel circuits PC may include the semiconductor layer, a gate electrode, a source electrode, and a drain electrode. For example, as illustrated in FIG. 4, the first thin-film transistor T1 may include a first semiconductor layer A1, a first gate electrode G1, a first source electrode S1, and a first drain electrode D1. Also, the second thin-film transistor T2 (see FIG. 3) may include a second semiconductor layer, a second gate electrode, a second source electrode, and a second drain electrode.

The semiconductor layer may be located on the buffer layer 101. The semiconductor layer may include a channel area, a source area and a drain area at both sides of the channel area, the source area and the drain area being doped with impurities. Here, the impurities may include N-type impurities or P-type impurities. The semiconductor layer may include amorphous silicon or polysilicon. For example, the semiconductor layer may include an oxide of at least one material selected from the group consisting of In, Ga, Sn, Zr, V, Hf, Cd, Ge, Cr, Ti, Al, Cs, Ce, and Zn. Also, the semiconductor layer may include Zn oxide-based materials, such as a Zn oxide, an In—Zn oxide, a Ga—In—Zn oxide, etc. Also, the semiconductor layer may include a semiconductor including a metal, such as In, Ga, or Sn, and ZnO. For example, the semiconductor layer may include In—Ga—Zn—O (IGZO), In—Sn—Zn—O (ITZO), or In—Ga—Sn—Zn—O (IGTZO).

The gate electrode may be located above the semiconductor layer to overlap at least a portion of the semiconductor layer. For example, the gate electrode may overlap the channel area of the semiconductor layer. The gate electrode may include various conductive materials including Mo, Al, Cu, Ti, etc. and may include various layered structures. For example, the gate electrode may include a Mo layer and an Al layer or may have a multi-layered structure of Mo/Al/Mo. Also, according to selective embodiments, the gate electrode may have a multi-layered structure including an ITO layer covering a metal material.

The source electrode and the drain electrode may also include various conductive materials including Mo, Al, Cu, Ti, etc. and may have various layered structures. For example, the source electrode and the drain electrode may include a Ti layer and an Al layer or may have a multi-layered structure of Ti/Al/Ti. The source electrode and the drain electrode may be connected to the source area and the drain area of the semiconductor layer through a contact hole. Also, according to some embodiments, the source electrode and the drain electrode may have a multi-layered structure including an ITO layer covering a metal material.

To obtain an insulating property between the semiconductor layer and the gate electrode, a first inorganic insulating layer 103 may be arranged between the semiconductor layer and the gate electrode. That is, the first inorganic insulating layer 103 may be located on the substrate 100 and below the gate electrode and may cover the semiconductor layer. The first inorganic insulating layer 103 may include an insulating layer including an inorganic material, such as silicon oxide, silicon nitride, and/or silicon oxynitride.

A second inorganic insulating layer 105 may be located on the first inorganic insulating layer 103 to cover the gate electrode. Also, the source electrode and the drain electrode may be located on the second inorganic insulating layer 105. The second inorganic insulating layer 105 may include an insulating layer including an inorganic material, such as silicon oxide, silicon nitride, and/or silicon oxynitride.

A protection layer 107 may be located on the second inorganic insulating layer 105 to cover the source electrode and the drain electrode. The protection layer may include an insulating layer including an inorganic material, such as silicon oxide, silicon nitride, and/or silicon oxynitride.

The insulating layers 103, 105, 107, etc. including the inorganic materials may be formed via chemical vapor deposition (CVD) or atomic layer deposition (ALD). However, the insulating layers 103, 105, 107, etc. are not limited thereto.

The storage capacitor Cst may include a lower electrode CE1 and an upper electrode CE2. The lower electrode CE1 and the upper electrode CE2 may overlap each other with the second inorganic insulating layer 105 therebewteen and may form a capacitance. In this case, the second inorganic insulating layer 105 may function as a dielectric layer of the storage capacitor Cst.

According to some embodiments, the lower electrode CE1 may be located on the same layer as the gate electrode. The lower electrode CE1 may include a same material as the gate electrode. For example, the lower electrode CE1 may include various conductive materials including Mo, Al, Cu, Ti, etc. and may have various layered structures (for example, a multi-layered structure of Mo/Al/Mo). The upper electrode CE2 may be located on the same layer as the source electrode and the drain electrode. The upper electrode CE2 may include a same material as the source electrode and the drain electrode. For example, the upper electrode CE2 may include various conductive materials including Mo, Al, Cu, Ti, etc. and may have various layered structures (for example, a multi-layered structure of Ti/Al/Ti).

An organic insulating layer 109 may be located on the source electrode and the drain electrode. The organic insulating layer 109 may be arranged above the substrate 100 throughout the display area and the peripheral area outside the display area. The organic insulating layer 109 may have a flat upper surface to form the display element layer 220 that is flat. The organic insulating layer 109 may include a single layer or multiple layers including an organic material.

The organic insulating layer 109 may include hexamethyldisiloxane (HMDSO), benzocyclobutene (BCB), polyimide (PI), polymethylmethacrylate (PMMA), or a general-purpose polymer, such as polystylene (PS), a polymer derivate having a phenol-based group, an acryl-based polymer, an imide-based polymer, an arylether-based polymer, an amide-based polymer, a fluorine-based polymer, a p-xylene-based polymer, a vinyl alcohol-based polymer, and a blend thereof.

The display element layer 220 may be located on the organic insulating layer 109.

The display element layer 220 may include a display element DPE. That is, the display element DPE may be located on the pixel circuit layer 210. As illustrated in FIG. 4, the display element DPE may be arranged in each pixel PX.

According to a type of the display element DPE, a display apparatus may correspond to an organic light-emitting display apparatus, an inorganic light-emitting display apparatus, a quantum dot light-emitting display apparatus, etc. However, the display apparatus is not limited thereto. For example, an emission layer of the display element DPE may include an organic material, an inorganic material, a quantum dot, an organic material and a quantum dot, an inorganic material and a quantum dot, or an organic material, an inorganic material, and a quantum dot. Also, the display element DPE may include a micro-light-emitting diode. Also, the display element DPE may include a nanorod-light-emitting diode. According to some embodiments, the nanorod-light-emitting diode may include GaN.

The display element DPE may be electrically connected to the thin-film transistor of the pixel circuit layer 210. For example, the display element DPE may be electrically connected to the source electrode or the drain electrode of the thin-film transistor.

The encapsulation layer 300 may be located on the display elements DPE. The encapsulation layer 300 may cover the display elements DPE to protect the display elements DPE from external moisture or oxygen. The encapsulation layer 300 may cover the display area and may extend to the outside of the display area.

According to some embodiments, the encapsulation layer 300 may include a first inorganic encapsulation layer, an organic encapsulation layer, and a second inorganic encapsulation layer.

The first inorganic encapsulation layer may include silicon oxide, silicon nitride, and/or silicon oxynitride. The first inorganic encapsulation layer may be formed along a structure therebelow, and thus, an upper surface of the first inorganic encapsulation layer may not be flat. The organic encapsulation layer may cover the first inorganic encapsulation layer. However, unlike the first inorganic encapsulation layer, an upper surface of the organic encapsulation layer may be substantially flat. For example, an upper surface of the organic encapsulation layer, the upper surface being in a location corresponding to the display area, may be substantially flat. The organic encapsulation layer may include at least one material selected from the group consisting of polyethylene terephthalate, polyethylene naphthalate, polycarbonate, polyimide, polyethylene sulfonate, polyoxymethylene, polyarylate, and HMDSO. The second inorganic encapsulation layer may cover the organic encapsulation layer and may include silicon oxide, silicon nitride, and/or silicon oxynitride. An edge of the second inorganic encapsulation layer, the edge being located at the outside of the display area, may contact the first inorganic encapsulation layer, so that the organic encapsulation layer may not be exposed to the outside.

Various functional layers, such as a touch screen layer, a polarization film, etc., may further be provided above the encapsulation layer 300.

According to some embodiments, a quantum dot layer 410 may be located on the encapsulation layer 300.

The quantum dot layer 410 may include a light-transmissive layer 411 located in the first pixel PX1, a second-color quantum dot layer 412 located in the second pixel PX2, and a third-color quantum dot layer 413 located in the third pixel PX3. When viewed in a direction (a z-axis direction) perpendicular to an upper surface of the substrate 100, each of the light-transmissive layer 411, the second-color quantum dot layer 412, and the third-color quantum dot layer 413 may overlap the display element DPE located in each of the first through third pixels PX1 through PX3. For example, the light-transmissive layer 411 may overlap the display element DPE located in the first pixel PX1, the second-color quantum dot layer 412 may overlap the display element DPE located in the second pixel PX2, and the third-color quantum dot layer 413 may overlap the display element DPE located in the third pixel PX3.

Also, the quantum dot layer 410 may include partition walls B1 arranged between the light-transmissive layer 411, the second-color quantum dot layer 412, and the third-color quantum dot layer 413. Emission areas of the first through third pixels PX1 through PX3 may be defined at areas between the partition walls B1 that are adjacent to each other. That is, the partition walls B1 may be patterned in non-emission areas and may function as light-shielding layers. The partition walls B1 may include a material (a photoresist) that is chemically changed when light is irradiated onto the material. For example, the partition walls B1 may include aromatic bis-azide, methacrylic acid ester, cinnamic acid ester, etc. as a negative photoresist, and polymethacrylic acid methyl, naphthine diazide, polybutene-1-sulfone, etc. as a positive photoresist, but are not limited to the above-described example. Also, according to some embodiments, the partition walls B1 may include a black pigment, a metal material, etc. for a function of the light-shielding layer and may include a reflective material, such as Al, Ag, etc. for increasing light efficiency.

The second-color quantum dot layer 412 may convert light of a wavelength in a first wavelength range generated by the display element DPE located in the second pixel PX2 into light of a wavelength in a second wavelength range. For example, when light of a wavelength in a wavelength range of about 450 nm to about 495 nm is generated by the display element DPE located in the second pixel PX2, the second-color quantum dot layer 412 may convert the light into light of a wavelength in a wavelength range of about 495 nm to about 570 nm. Thus, the second pixel PX2 may emit the light of the wavelength in the wavelength range of about 495 nm to about 570 nm to the outside.

The third-color quantum dot layer 413 may convert the light of the wavelength in the first wavelength range generated by the display element DPE located in the third pixel PX3 into light of a wavelength in a third wavelength range. For example, when the light of the wavelength in the wavelength range of about 450 nm to about 495 nm is generated by the display element DPE located in the third pixel PX3, the third-color quantum dot layer 413 may convert the light into light of a wavelength in a wavelength range of about 630 nm to about 780 nm. Thus, the third pixel PX3 may emit the light of the wavelength in the wavelength range of about 630 nm to about 780 nm to the outside.

Each of the second-color quantum dot layer 412 and the third-color quantum dot layer 413 may have the form in which quantum dots are distributed in a resin.

A size of the quantum dot may correspond to several nanometers, and according to a particle size of the quantum dot, light may have a changed wavelength after conversion. That is, the quantum dot may adjust a color of light that is emitted, according to the particle size, and thus, the quantum dot may have various emission colors, such as blue, red, green, etc. The particle size of the quantum dot may have a full width at half maximum (FWHM) of an emission wavelength spectrum that is equal to or less than about 45 nm, or according to some embodiments, equal to or less than about 40 nm, and according to some embodiments, equal to or less than about 30 nm. Also, in this range, a color purity or color reproduction may be improved. Also, the light emitted through the quantum dot may be emitted in all directions, and thus, a light viewing angle may be improved. Also, a shape of the quantum dot corresponds to a shape that is well-known in the art and is not particularly limited. However, according to some embodiments, the quantum dot may have a spherical shape, a pyramid shape, a multi-arm shape, a cubic nano-particle shape, a nano-tube shape, a nano-wire shape, a nano-fiber shape, a nano-plate particle shape, etc. Also, the quantum dot may include a semiconductor material, such as CdS, CdTe, ZnS, InP, or the like.

The resins included in the second-color quantum dot layer 412 and the third-color quantum dot layer 413 may include any light-transmissive material. For example, polymer resins, such as silicon resins, epoxy resins, acryl, BCB, HMDSO, etc., may be used as materials included in the second-color quantum dot layer 412 and the third-color quantum dot layer 413.

The quantum dot layer 410 may include the light-transmissive layer 411 located in the first pixel PX1. For example, when the display element DPE of the display element layer 220 includes a first-color emission layer emitting light of a wavelength in a first wavelength range, the first pixel PX1 may emit the light generated by the display element DPE to the outside without converting the wavelength of the light. Thus, because the first pixel PX1 does not additionally need a first-color quantum dot layer, the quantum dot layer 410 may include the transmissive layer 411 including a transmissive resin.

Also, in a manufacturing process or during a use after the manufacturing process, it may be needed to prevent damage to the second-color quantum dot layer 412 and the third-color quantum dot layer 413. To this end, a first protection layer IL1 may be located on the quantum dot layer 410. The first protection layer IL1 may include an inorganic material layer including silicon oxide, silicon nitride, or silicon oxynitride, in order to prevent or reduce gas penetration. Also, the first protection layer IL1 may include an organic material including at least one material selected from the group consisting of polyethylene terephthalate, polyethylene naphthalate, polycarbonate, polyimide, polyethylene sulfonate, polyoxymethylene, polyarylate, and HMDSO.

The color filter layer 420 may be located on the quantum dot layer 410.

According to some embodiments, the color filter layer 420 may include a first-color color filter 421 located in the first pixel PX1, a second-color color filter 422 located in the second pixel PX2, and a third-color color filter 423 located in the third pixel PX3. The first-color color filter 421 may overlap the display element DPE located in the first pixel PX1, the second-color color filter 422 may overlap the display element DPE located in the second pixel PX2, and the third-color color filter 423 may overlap the display element DPE located in the third pixel PX3.

The first-color color filter 421 may transmit only light of a wavelength in a wavelength range of about 450 nm to about 495 nm, the second-color color filter 422 may transmit only light of a wavelength in a wavelength range of about 495 nm to about 570 nm, and the third-color color filter 423 may transmit only light of a wavelength in a wavelength range of about 630 nm to about 780 nm. The first-color color filter 421 through the third-color color filter 423 may reduce reflection of external light in the display apparatus 1.

Also, the color filter layer 420 may include a black matrix B2. The black matrix B2 may include a first portion and a second portion.

The first portion of the black matrix B2 may be arranged between the first-color color filter 421, the second-color color filter 422, and the third-color color filter 423. The first portion of the black matrix B2 may be located in the display area and may define the emission areas of the first through third pixels PX1 through PX3.

The second portion of the black matrix B2 may have a side and another side, wherein the side contacts a color filter that is most adjacent to an edge of the substrate 100 from among the color filters, and the other side extends in a direction of the edge of the substrate 100. The second portion of the black matrix B2 may be located in an edge area of the substrate 100 and may function as a light-shielding layer. According to some embodiments, an end of the second portion of the black matrix B2 may not form a step difference with the edge of the substrate 100. That is, the second portion of the black matrix B2 may extend to an area overlapping the edge of the substrate 100.

The black matrix B2 may include a material (a photoresist) that is chemically changed when light is irradiated onto the black matrix B2. For example, the black matrix B2 may include aromatic bis-azide, methacrylic acid ester, cinnamic acid ester, etc. as a negative photoresist, and polymethacrylic acid methyl, naphthine diazide, polybutene-1-sulfone, etc. as a positive photoresist, but is not limited to the above-described example. Also, according to some embodiments, the black matrix B2 may include a black pigment, a metal material, etc. for a function of the light-shielding layer and may include a reflective material, such as Al, Ag, etc. for increasing light efficiency.

Figure 5A:
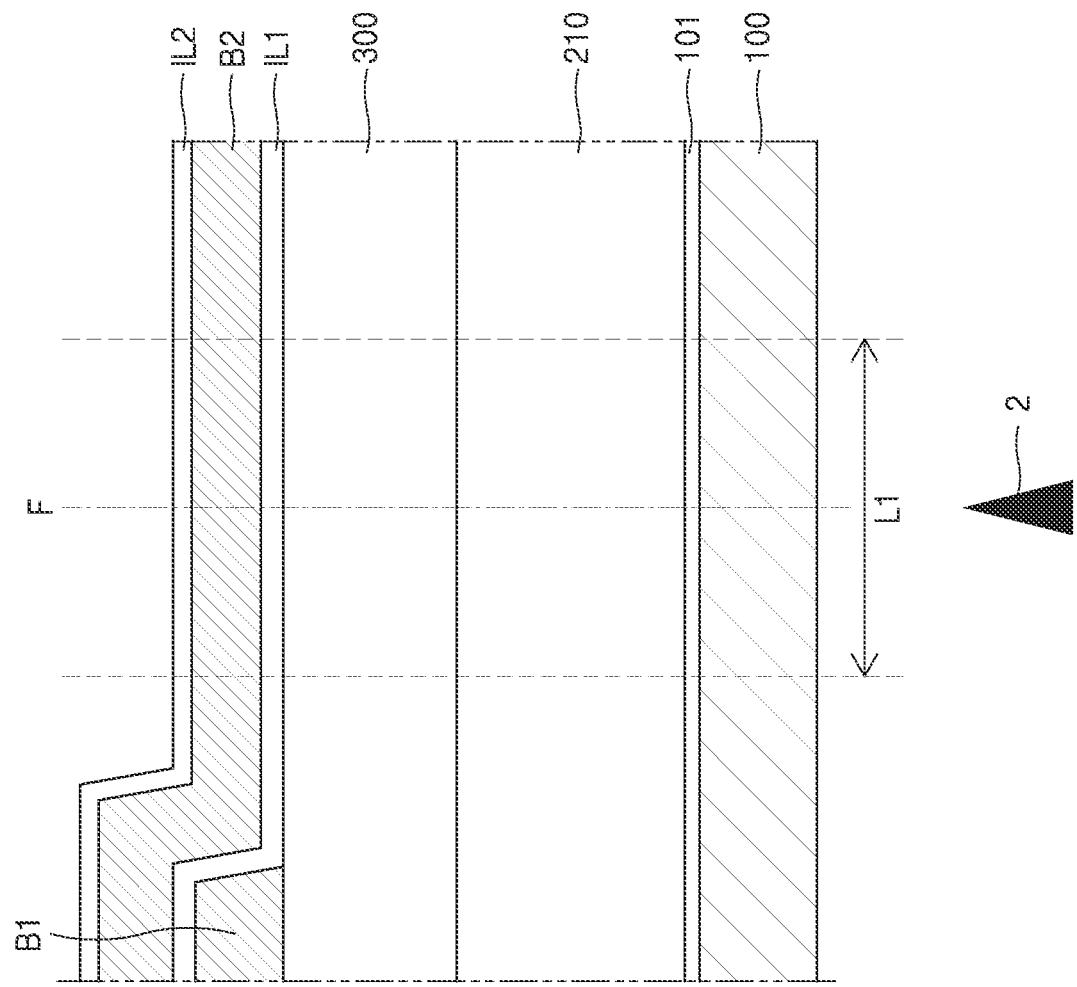
FIGS. 5A and 5B are schematic cross-sectional views for sequentially showing a portion of a cutting process according to some embodiments.
Figure 5B:
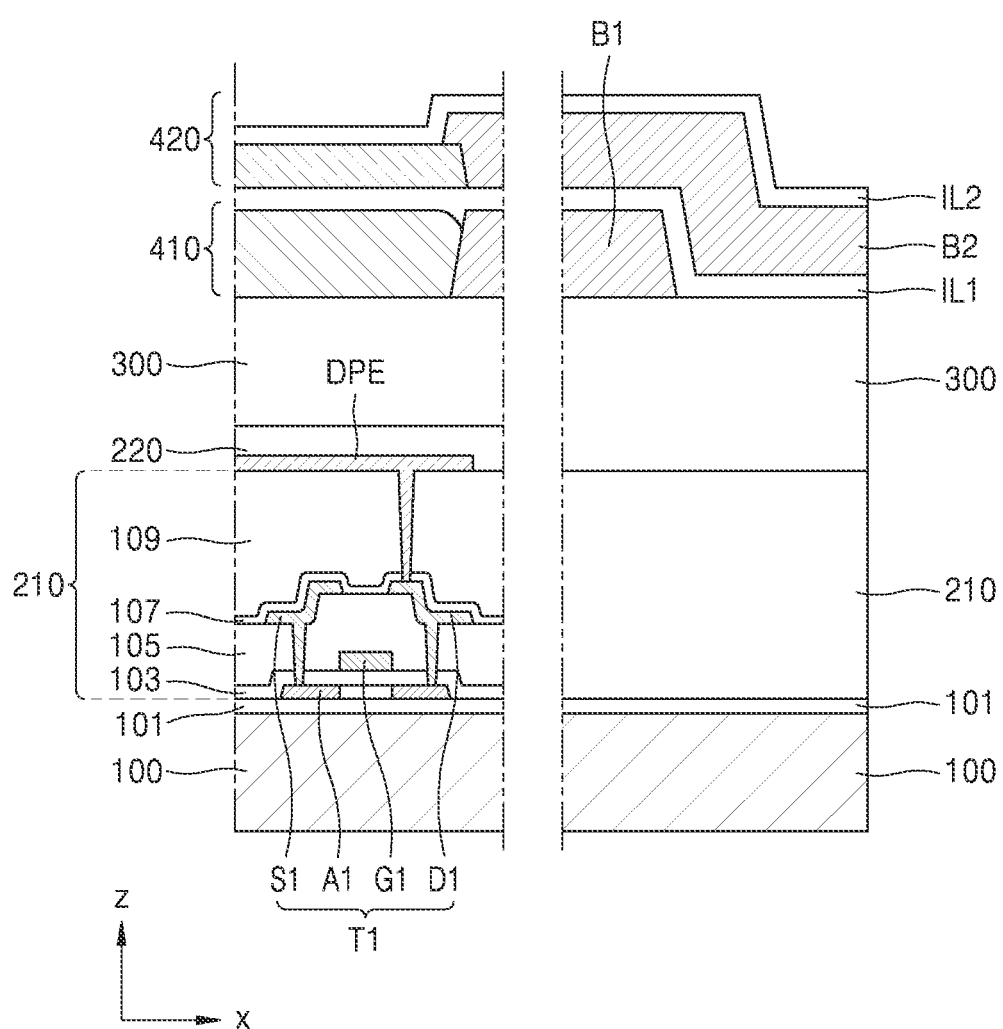

FIGS. 5A and 5B are schematic cross-sectional views for sequentially showing a portion of a cutting process according to some embodiments.

FIG. 5A may be the cross-sectional view of an edge area of the cell area CA (see FIG. 1) of the mother substrate MG (see FIG. 1) before a cutting process, and FIG. 5B may be the cross-sectional view of the edge area of the display apparatus after the cutting process. Here, the "edge area" denotes an area in which edges forming boundaries are located.

A method of manufacturing a display apparatus according to some embodiments may include forming the bottom metal layer 102 (see FIG. 7), the pixel circuit layer 210, and the blocking layer 500 (see FIG. 7) on the substrate 100, forming the display element layer 220 on the pixel circuit layer 210, forming the encapsulation layer 300 on the display element layer 220, forming the quantum dot layer 410 on the encapsulation layer 300, forming the color filter layer 420 on the quantum dot layer 410, and cutting the substrate 100.

The cutting of the substrate 100 may correspond to cutting a resultant object of sequentially forming the pixel circuit layer 210, the display element layer 220, the encapsulation layer 300, the quantum dot layer 410, and the color filter layer 420 on the substrate 100 in such a way that the resultant object is simultaneously (or concurrently) cut from a lower surface thereof through an upper surface thereof. When the cutting process is performed on the edge area of the cell area CA of the mother substrate MG, a display panel may have an end that is formed along a cutting line.

According to some embodiments, the cutting process may adopt a laser cutting method. The laser cutting method may be a method, according to which a laser beam is focused on a cutting line of a cutting object and shocks in the form of pulses are applied to materials to cut the cutting object. In this case, an applied laser beam may include a $CO_2$ laser beam, a YAG laser beam a nano-second laser beam, a femto second laser beam, a Bessel beam, or a Gaussian beam, but is not limited thereto.

The laser cutting method described above may generate a tolerance (e.g., a set or predetermined tolerance) L1 as illustrated in FIG. 5A. That is, areas that are apart, by an error distance (e.g., a set or predetermined error distance), from both sides of a central portion F of the laser beam irradiated from a laser cutting device 2, may be exposed to laser energy. For example, when, as an example of the laser cutting method, a cutting method is applied, the cutting method applying constructive interference with respect to an area in which two laser beams cross and overlap each other, the laser beams may be broadly irradiated onto areas except for the area in which the constructive interference occurs.

FIGS. 5A and 5B illustrate for convenience that an end of a range of the tolerance L1 corresponds to the end of the substrate 100. However, the central portion F of the laser beam may be arranged such that the end of the range of the tolerance L1 is apart from the end of the substrate 100 by a distance (e.g., a set or predetermined distance), in order to prevent or reduce thermal damage to an area adjacent to the range of the tolerance L1.

As described above, the tolerance of the laser beam or the laser beam that is broadly irradiated may damage layers in an area adjacent to the cutting line during the cutting process, to degrade the quality of the display apparatus. For example, because layers stacked in the display panel may have different absorption rates according to wavelengths, certain layers may be excessively cut, or it may be difficult to obtain the uniformity. For example, when a display panel, which is to be cut, includes the black matrix B2 having a high energy absorption rate, the black matrix B2 located in an area adjacent to the central portion F of a laser beam may absorb the laser energy and may be damaged. In other words, while FIG. 5B illustrates for convenience that an end of the display panel is smooth, one or more (for example, the black matrix) of stacked layers may be excessively removed and the end may be indented toward the inside.

As described above, when the layers in the area adjacent to the cutting line are damaged, a non-display area of a display apparatus may be increased. Also, according to some embodiments, in the case of a tile structure in which a plurality of display panels are connected, the damaged layers may function as a seam line between the display panels, so as to deteriorate the display quality.

To solve these problems, the display apparatus 1 according to embodiments may further include the blocking layer 500. Hereinafter, the blocking layer 500 will be described in more detail with reference to FIGS. 6 through 13. When describing the embodiments, like reference numerals in the drawings refer to like elements, and thus, aspects that are the same as described above will not be repeatedly described.

Figure 6:
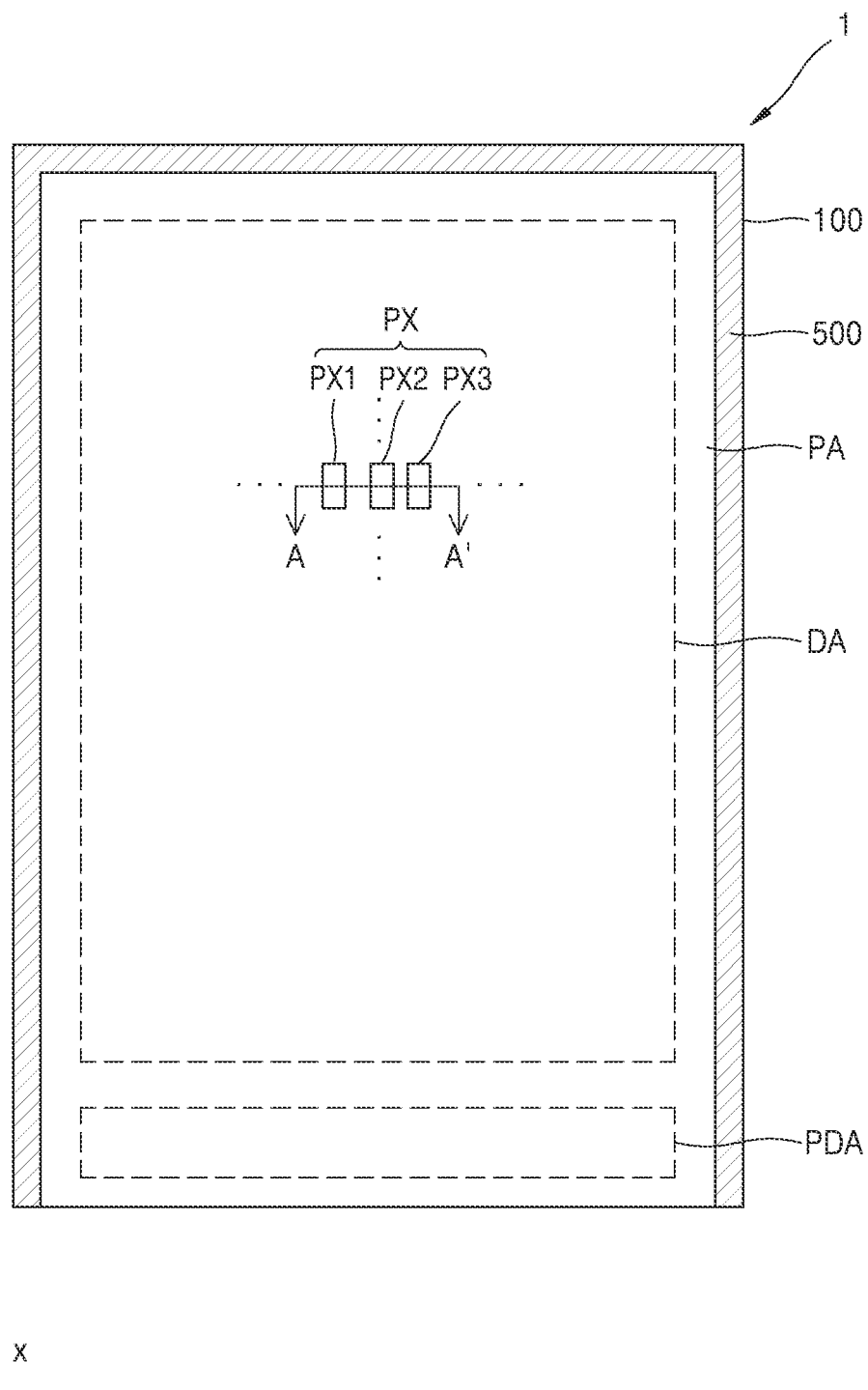
FIG. 6 is a schematic plan view of a portion of a display apparatus according to some embodiments.

FIG. 6 is a schematic plan view of a portion of the display apparatus 1 according to some embodiments.

As illustrated in FIG. 6, the display apparatus 1 according to some embodiments may include the blocking layer 500 surrounding at least a side of an edge area of the substrate 100. That is, the blocking layer 500 may extend along at least one edge of the substrate 100.

FIG. 6 illustrates that the blocking layer 500 extends along remaining edges except for an edge adjacent to the pad portion PAD from among edges of the substrate 100. However, the blocking layer 500 is not limited thereto. For example, the blocking layer 500 may extend along all of the edges of the substrate 100 or may extend along one or two of the edges of the substrate 100.

During a cutting process, the blocking layer 500 may protect layers in an area adjacent to a cutting line from a laser beam. For example, in the cutting process, the blocking layer 500 may be located to be more adjacent to the laser cutting device 2 (see FIG. 5A) than the layers to be protected. Thus, the blocking layer 500 may prevent and block energy from reaching the layers to be protected. That is, the blocking layer 500 may be located before the layers to be protected on a laser path. The blocking layer 500, rather than the layers to be protected, may absorb and emit the laser energy. For example, the blocking layer 500 may be arranged between the substrate 100 and the black matrix B2. In this case, the blocking layer 500 may be exposed, before the black matrix B2, to the laser beam irradiated from below the substrate 100 and may emit the laser beam. Thus, the blocking layer 500 may prevent, reduce, or minimize reaching of the laser energy to the black matrix B2 in an area overlapping the blocking layer 500.

Also, the blocking layer 500 may provide a reference point of the cutting line in the cutting process. For example, an edge of the cell area may be cut based on a tip end of the blocking layer 500 in the cutting process. An end of the display panel after the cutting process may correspond to the tip end of the blocking layer 500. For example, an edge of the substrate 100 and an end of the black matrix B2 may not form a step difference with the tip end of the blocking layer 500. Also, the substrate 100, the black matrix B2, and ends of the layers arranged therebetween may form edges of the display panel and may not form a step difference with the tip end of the blocking layer 500.

To use the blocking layer 500 as the reference point of the cutting line, an align key or an align pattern may be arranged in a portion (e.g., a set or predetermined portion) of the blocking layer 500. The laser cutting device 2 (see FIG. 5A) may sense the align key or the align pattern and sense a location of the tip end of the blocking layer 500. Also, the laser cutting device 2 may arrange the central portion F (see FIG. 5A) at areas apart from the tip end of the blocking layer 500 by a distance (e.g., a set or predetermined distance) and may irradiate a laser beam. Here, the distance (e.g., the set or predetermined distance) may be set by taking into account the tolerance L1 (see FIG. 5A) and a distance subject to thermal damage.

The blocking layer 500 may include a metal material. According to some embodiments, the blocking layer 500 may have a greater thermal conductivity than the black matrix B2 in order to efficiently protect the black matrix B2. To this end, the blocking layer 500 may include a metal having a high thermal conductivity. For example, the blocking layer 500 may include a metal, such as Ag, Cu, Au, Al, W, etc.

FIGS. 7 through 13 are schematic cross-sectional views of the blocking layer 500 according to embodiments.

Figure 7:
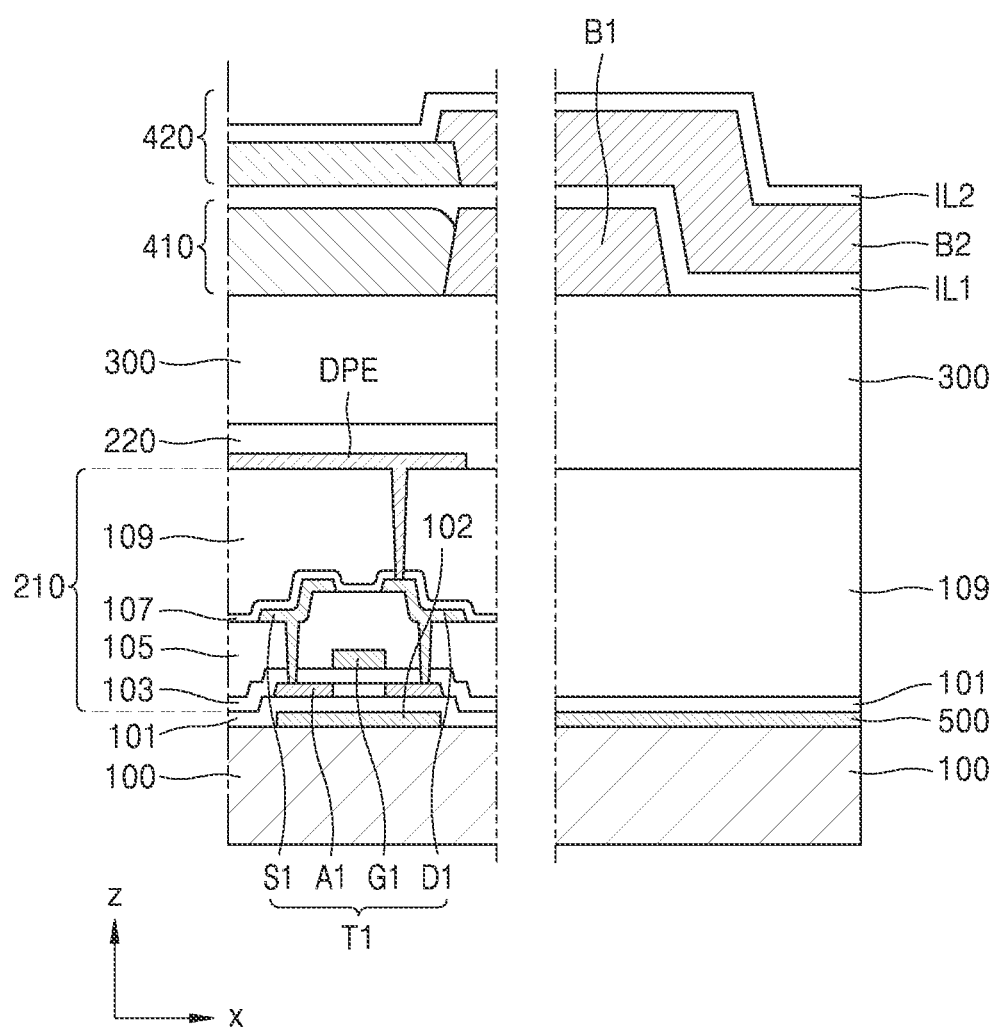
FIG. 7 is a schematic cross-sectional view of a blocking layer according to some embodiments.
Figure 8:
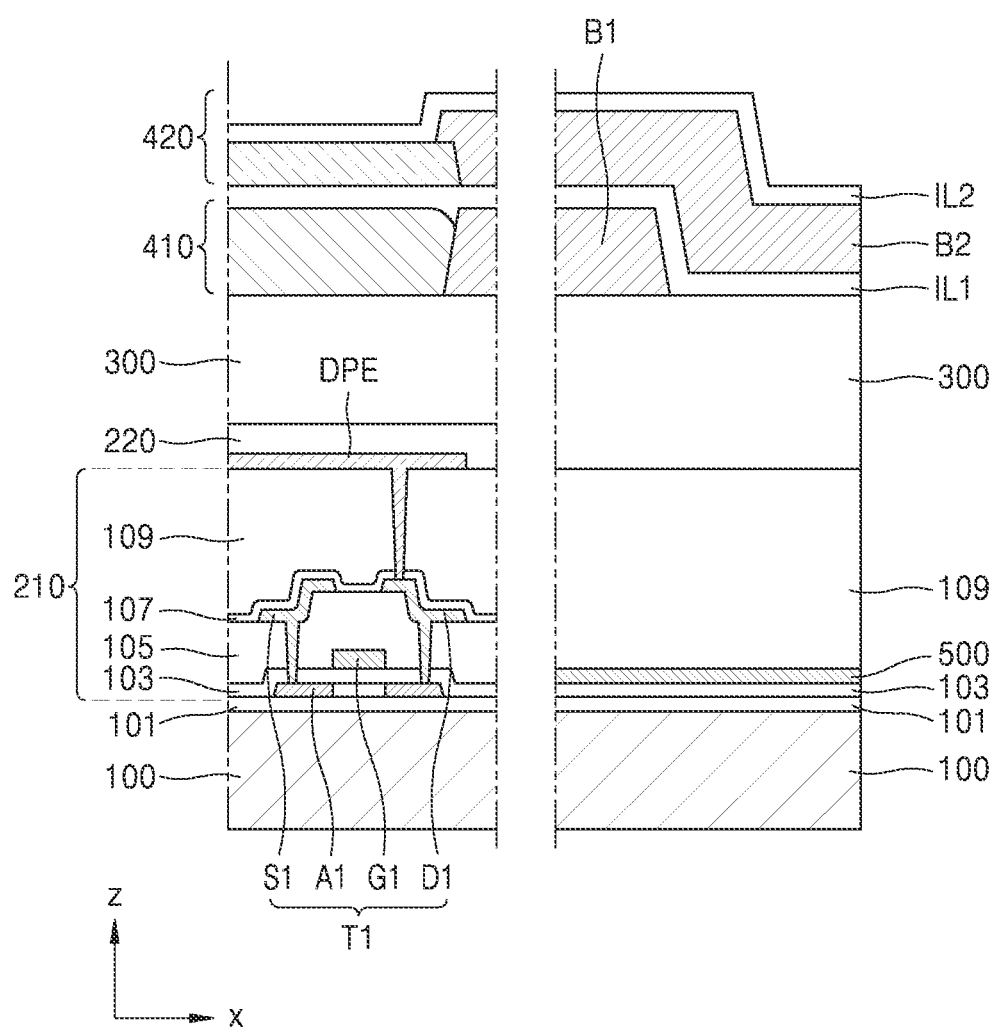
FIG. 8 is a schematic cross-sectional view of a blocking layer according to some embodiments.
Figure 9:
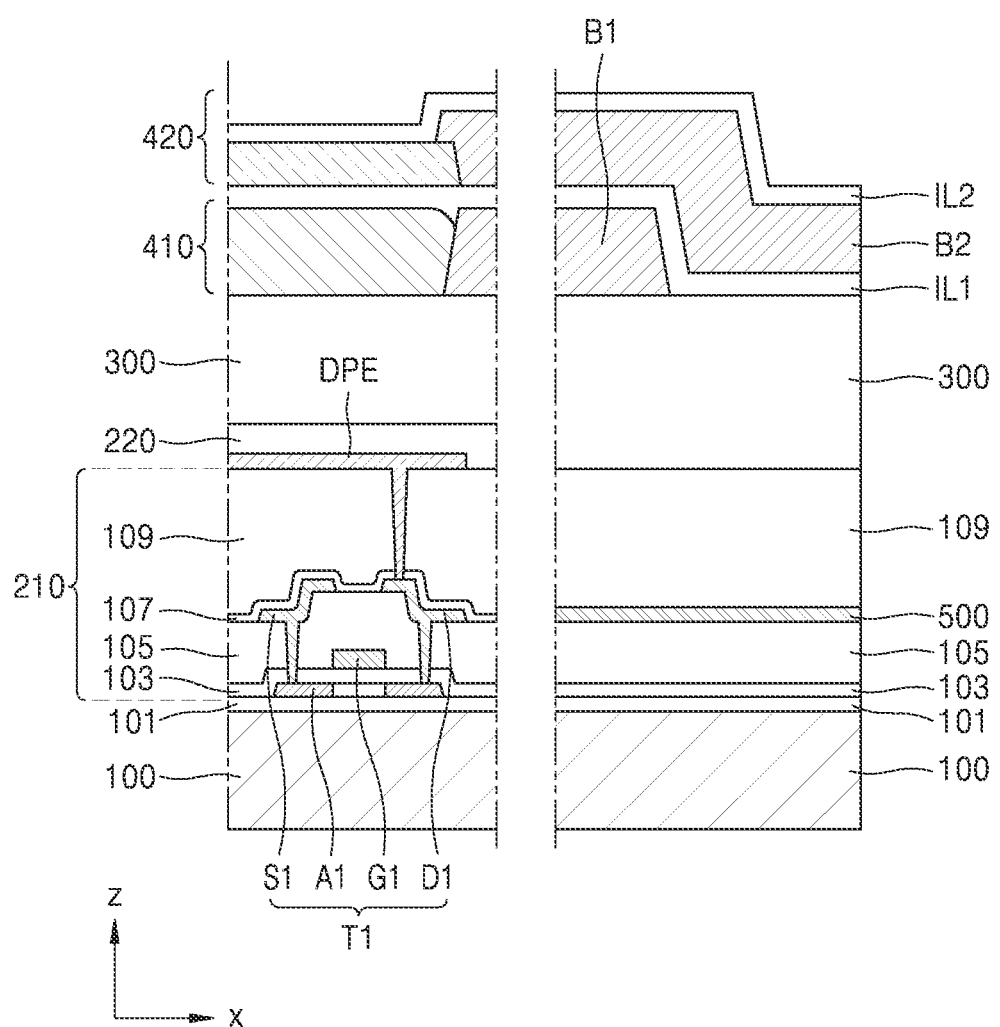
FIG. 9 is a schematic cross-sectional view of a blocking layer according to some embodiments.

For example, FIGS. 7 through 9 illustrate that the blocking layer 500 has a single-layered structure, according to embodiments, and FIGS. 10 through 13 illustrate that the blocking layer 500 has a multi-layered structure, according to embodiments.

According to some embodiments, the blocking layer 500 may include a same material as a layer (e.g., a set or predetermined layer) included in the display apparatus 1. That is, the blocking layer 500 may be simultaneously (or concurrently) formed with the layer during a process in which the layer included in the display apparatus is formed. Like this, without adding a separate process for forming the blocking layer 500, the previous processes may be used. Thus, the efficiency of a manufacturing process of the display apparatus may be improved.

Referring to FIG. 7, the blocking layer 500 may include a same material as the bottom metal layer 102. Also, the blocking layer 500 may be simultaneously (or concurrently) formed with the bottom metal layer 102 during a process in which the bottom metal layer 102 is formed.

FIG. 7 illustrates a case in which the buffer layer 101 may be located on the blocking layer 500 and the organic insulating layer 109 may be located on the buffer layer 101. However, the layers arranged between the blocking layer 500 and the black matrix B2 are not limited thereto and may be variously modified. For example, the buffer layer 101 may not be located on the blocking layer 500, and the first inorganic insulating layer 103, the second inorganic insulating layer 105, and/or the protection layer 107 may be located on the blocking layer 500.

Referring to FIG. 8, the blocking layer 500 may include a same material as the gate electrode of the thin-film transistor. Also, the blocking layer 500 may be simultaneously (or concurrently) formed with the gate electrode during a process in which the gate electrode is formed.

FIG. 8 illustrates a case in which the buffer layer 101 and the first inorganic insulating layer 103 are arranged between the substrate 100 and the blocking layer 500, and the organic insulating layer 109 may be located on the blocking layer 500. However, the layers arranged between the substrate 100 and the blocking layer 500 and between the blocking layer 500 and the black matrix B2 are not limited thereto and may be variously modified. For example, the buffer layer 101 and/or the first inorganic insulating layer 103 may not be arranged between the substrate 100 and the blocking layer 500, or the second inorganic insulating layer 105 and/or the protection layer 107 may be located on the blocking layer 500.

Referring to FIG. 9, the blocking layer 500 may include a same material as the source electrode or the drain electrode of the thin-film transistor. Also, the blocking layer 500 may be simultaneously (or concurrently) formed with the source electrode or the gate electrode in a process in which the source electrode or the gate electrode is formed.

FIG. 9 illustrates a case in which the buffer layer 101, the first inorganic insulating layer 103, and the second inorganic insulating layer 105 are arranged between the substrate 100 and the blocking layer 500, and the organic insulating layer 109 is located on the blocking layer 500. However, the layers arranged between the substrate 100 and the blocking layer 500 and between the blocking layer 500 and the black matrix B2 are not limited thereto and may be variously modified. For example, the buffer layer 101, the first inorganic insulating layer 103, and/or the second inorganic insulating layer 105 may not be arranged between the substrate 100 and the blocking layer 500, or the protection layer 107 may be located on the blocking layer 500.

Referring to FIGS. 10 through 13, the blocking layer 500 may have the multi-layered structure in which a plurality of layers are stacked. Here, the number of layers included in the blocking layer 500 is not limited. For example, the blocking layer 500 may have a double layer structure including a first layer 510 and a second layer 520 or may have a triple layer structure including the first layer 510, the second layer 520, and a third layer. When the blocking layer 500 has the multi-layered structure as described above, absorption of a laser beam, performed by the blocking layer 500, may be improved, and thus, layers in an area adjacent to a cutting line may be efficiently protected from the laser beam.

According to some embodiments, each of the first layer 510 and the second layer 520 may include a same material as a layer (e.g., a set or predetermined layer) included in a display apparatus. That is, each of the first layer 510 and the second layer 520 may be simultaneously (or concurrently) formed with the layer (e.g., the set or predetermined layer) included in the display apparatus in a process in which the layer is formed. Also, at least one layer may be arranged between the plurality of layers included in the blocking layer 500. That is, the first layer 510 and the second layer 520 may not contact each other and may be arranged to be apart from each other. Based on this structure, remaining laser energy that is not absorbed by the first layer 510 may be absorbed by the second layer 520. Accordingly, a laser path may be relatively more efficiently blocked.

Figure 10:
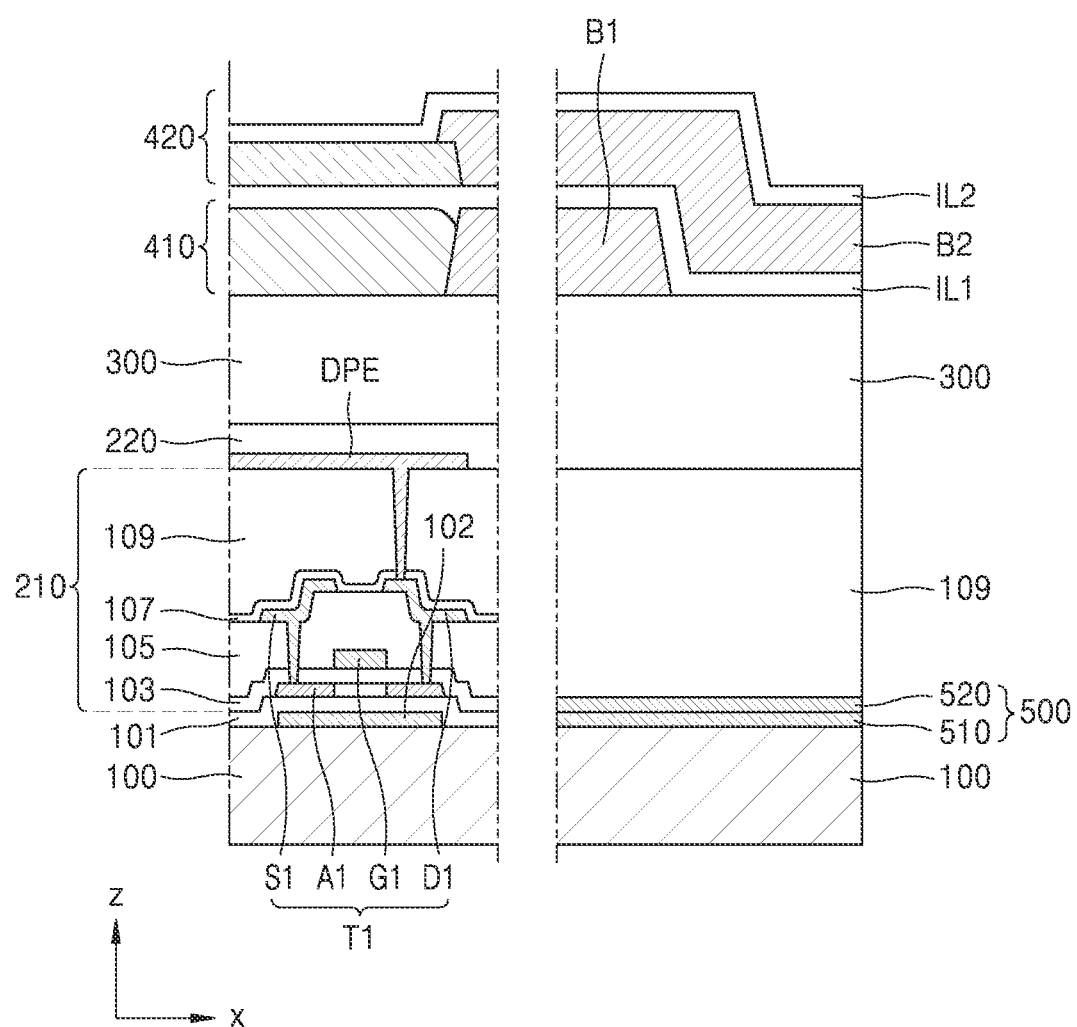
FIG. 10 is a schematic cross-sectional view of a blocking layer according to some embodiments.

Referring to FIG. 10, the blocking layer 500 may include the first layer 510 including a same material as the bottom metal layer 102 and the second layer 520 including a same material as the gate electrode. That is, the first layer 510 may be simultaneously (or concurrently) formed with the bottom metal layer 102 when the bottom metal layer 102 is formed, and the second layer 520 may be simultaneously (or concurrently) formed with the gate electrode when the gate electrode is formed.

Also, at least one of layers arranged between the bottom metal layer 102 and the gate electrode may be arranged between the first layer 510 and the second layer 520. For example, the buffer layer 101 and/or the first inorganic insulating layer 103 may be arranged between the first layer 510 and the second layer 520.

Also, unlike the embodiments described with respect to FIG. 10, the blocking layer 500 may include the first layer 510 including a same material as the bottom metal layer 102 and the second layer 520 including a same material as the source electrode or the drain electrode. In this case, the first layer 510 may be simultaneously (or concurrently) formed with the bottom metal layer 102 when the bottom metal layer 102 is formed, and the second layer 520 may be simultaneously (or concurrently) formed with the source electrode or the drain electrode when the source electrode or the drain electrode is formed. Also, at least one of layers arranged between the bottom metal layer 102 and the source electrode or between the bottom metal layer 102 and the drain electrode may be arranged between the first layer 510 and the second layer 520.

According to some embodiments, the layers included in the blocking layer 500 may contact each other. For example, an upper surface of the first layer 510 may contact a lower surface of the second layer 520. That is, the blocking layer 500 may have a structure in which the first layer 510 and the second layer 520 are coupled to each other. The laser energy absorbed by each of the first layer 510 and the second layer 520 may be delivered from the first layer 510 to the second layer 520 or from the second layer 520 to the first layer 510. Based on this structure, the blocking layer 500 may relatively more efficiently emit the absorbed laser energy.

Figure 11:
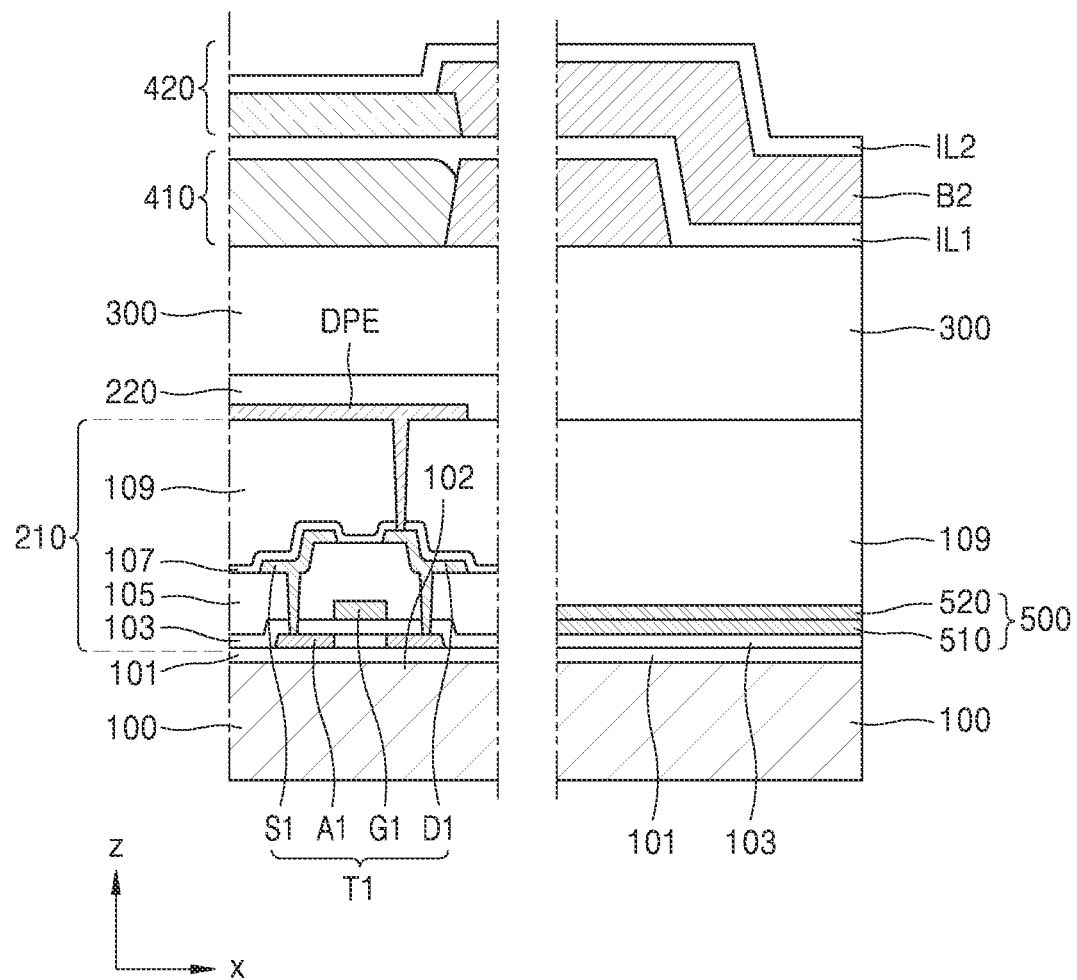
FIG. 11 is a schematic cross-sectional view of a blocking layer according to some embodiments.

Referring to FIG. 11, the blocking layer 500 may include the first layer 510 including a same material as the bottom metal layer 102 and the second layer 520 including a same material as the gate electrode. That is, the first layer 510 may be simultaneously (or concurrently) formed with the bottom metal layer 102 when the bottom metal layer 102 is formed, and the second layer 520 may be simultaneously (or concurrently) formed with the gate electrode when the gate electrode is formed. Here, no layer may be arranged between the first layer 510 and the second layer 520, so that the upper surface of the first layer 510 and the lower surface of the second layer 520 may contact each other.

Also, unlike the embodiments described with respect to FIG. 11, the blocking layer 500 may include the first layer 510 including a same material as the bottom metal layer 102 and the second layer 520 including a same material as the source electrode or the drain electrode. In this case, the first layer 510 may be simultaneously (or concurrently) formed with the bottom metal layer 102 when the bottom metal layer 102 is formed, and the second layer 520 may be simultaneously (or concurrently) formed with the source electrode or the drain electrode when the source electrode or the drain electrode is formed. Also, no layer may be arranged between the first layer 510 and the second layer 520, so that the upper surface of the first layer 510 and the lower surface of the second layer 520 may contact each other.

Figure 12:
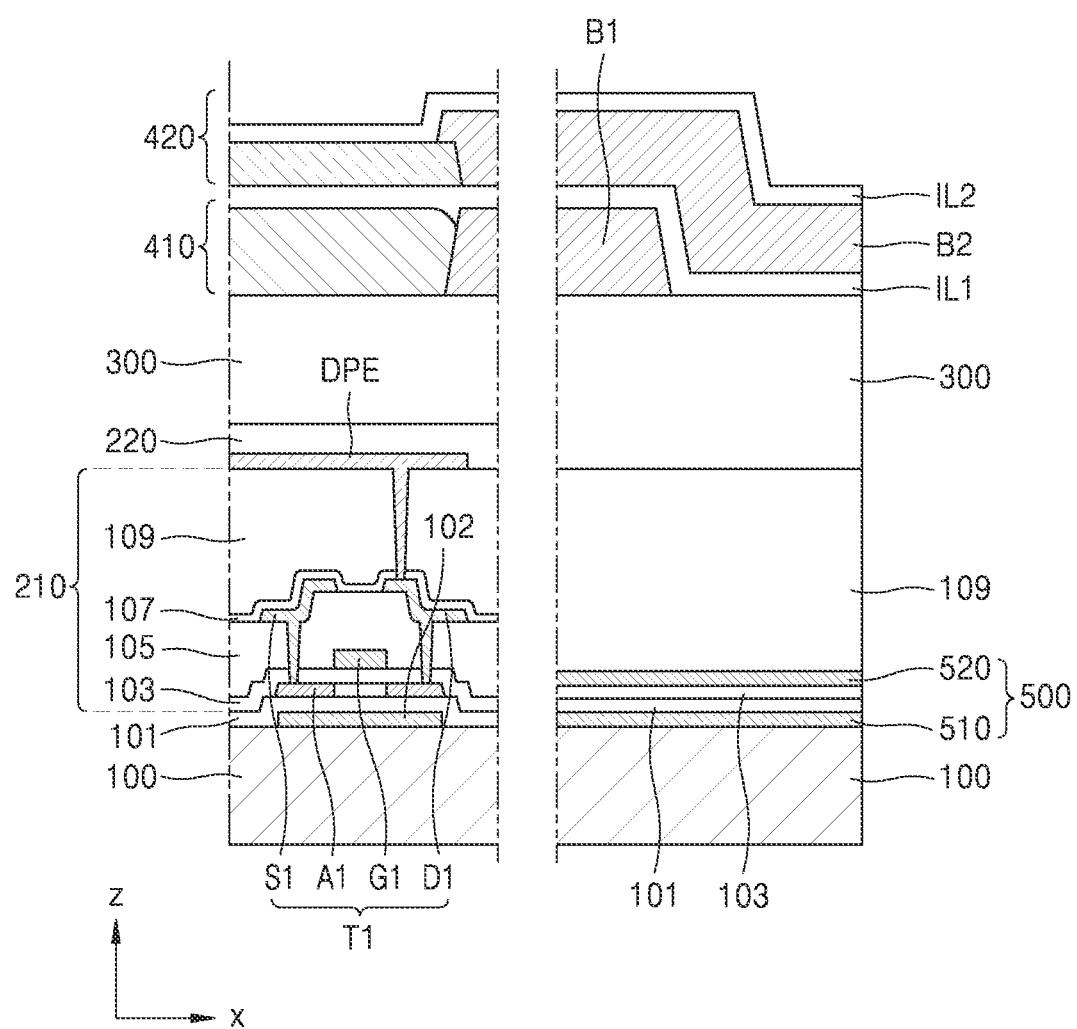
FIG. 12 is a schematic cross-sectional view of a blocking layer according to some embodiments.

Referring to FIG. 12, the blocking layer 500 may include the first layer 510 including a same material as the gate electrode and the second layer 520 including a same material as the source electrode or the drain electrode. That is, the first layer 510 may be simultaneously (or concurrently) formed with the gate electrode when the gate electrode is formed, and the second layer 520 may be simultaneously (or concurrently) formed with the source electrode or the drain electrode when the source electrode or the drain electrode is formed. Here, no layer may be arranged between the first layer 510 and the second layer 520, so that the upper surface of the first layer 510 and the lower surface of the second layer 520 may contact each other.

According to some embodiments, when at least one layer is arranged between the layers included in the blocking layer 500, the blocking layer 500 may further include at least one contact hole 521 connecting the layers included in the blocking layer 500. Here, the at least one contact hole 521 may be formed in a layer arranged between the layers included in the blocking layer 500. That is, while the first layer 510 and the second layer 520 may be located to be apart from each other and may not contact each other, the first layer 510 and the second layer 520 may be connected to each other through the contact hole 521. Based on this structure, remaining laser energy that is not absorbed by the first layer 510 may be absorbed by the second layer 520, and thus, a laser path may be relatively more efficiently blocked. Also, because the laser energy absorbed by each of the first layer 510 and the second layer 520 may be delivered from the first layer 510 to the second layer 520 or from the second layer 520 to the first layer 510, the absorbed energy may be relatively more efficiently emitted.

Figure 13:
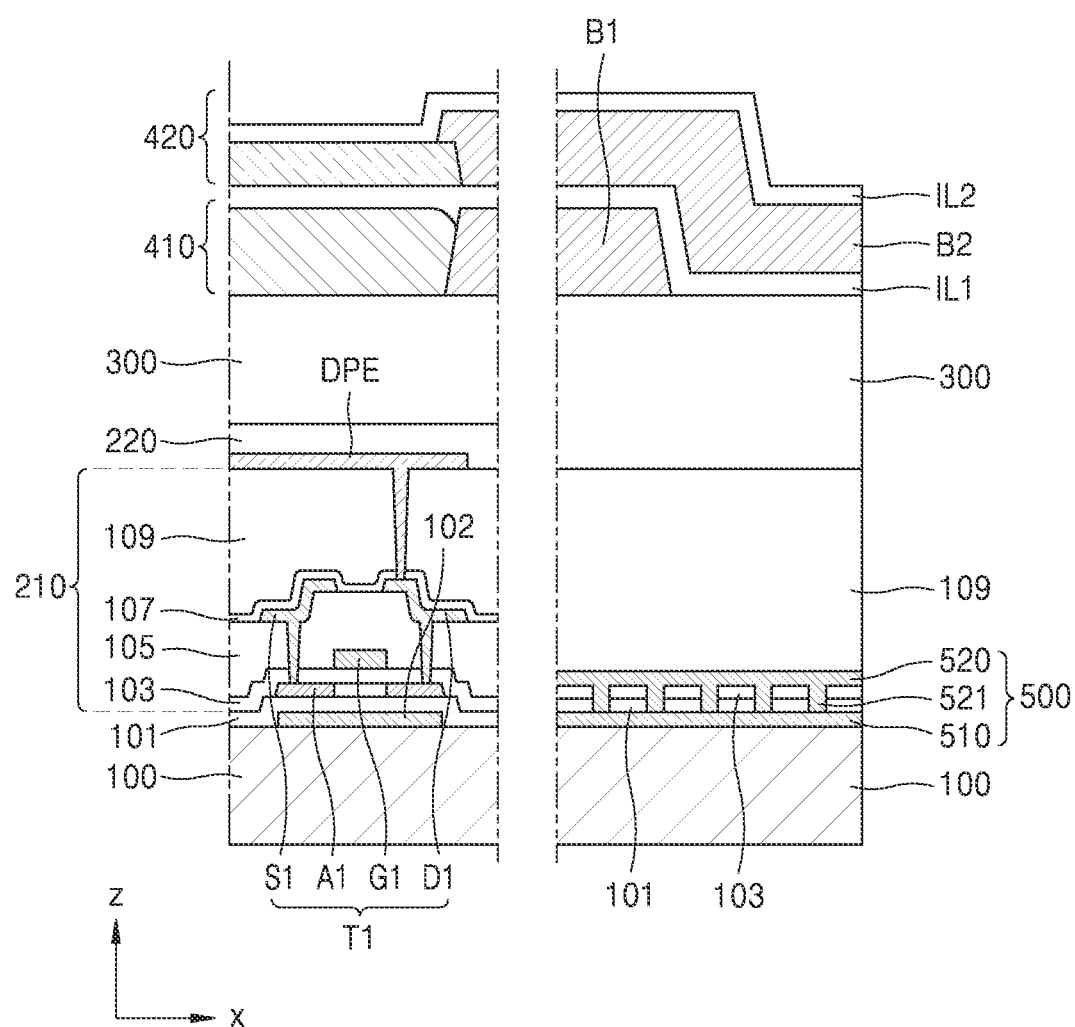
FIG. 13 is a schematic cross-sectional view of a blocking layer according to some embodiments.

Referring to FIG. 13, the blocking layer 500 may include the first layer 510 including a same material as the bottom metal layer 102 and the second layer 520 including a same material as the gate electrode (or the source electrode or the drain electrode), wherein the buffer layer 101, the first inorganic insulating layer 103, and/or the second inorganic insulating layer 105 may be arranged between the first layer 510 and the second layer 520. Also, the blocking layer 500 may include the at least one contact hole 521 in the layer(s) arranged between the first layer 510 and the second layer 520. The number of contact holes 521 included in the blocking layer 500, distances between the contact holes 521, and a pattern of the contact holes 521 are not limited and may be variously modified according to a design.

As described above, according to the one or more of the above embodiments of the disclosure, a display apparatus and a method of manufacturing the display apparatus may be realized, whereby an area of a non-display area may be minimized or relatively reduced by improving a cutting process, and the image quality may be improved. However, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
 a substrate;
 a pixel circuit layer on the substrate and including a thin-film transistor;
 a display element layer on the pixel circuit layer and including a display element electrically connected to the thin-film transistor;
 a color filter layer on the display element layer and including a color filter overlapping the display element and a black matrix having a first side contacting the color filter and a second side extending in an edge direction of the substrate; and
 a blocking layer between the black matrix and the substrate,
 wherein a tip end of the blocking layer has no step difference with an end of the black matrix and with an edge of the substrate.

2. The display apparatus of claim 1, further comprising a bottom metal layer between a semiconductor layer of the thin-film transistor and the substrate,
 wherein the blocking layer and the bottom metal layer include a same material.

3. The display apparatus of claim 1, wherein the blocking layer and a gate electrode of the thin-film transistor or the blocking layer and a source electrode of the thin-film transistor include a same material.

4. The display apparatus of claim 1, wherein the blocking layer includes a first layer and a second layer on the first layer.

5. The display apparatus of claim 4, further comprising a bottom metal layer between a semiconductor layer of the thin-film transistor and the substrate,
 wherein the first layer and the bottom metal layer include a same material, and
 the second layer and a gate electrode of the thin-film transistor or the second layer and a source electrode of the thin-film transistor include a same material.

6. The display apparatus of claim 4, wherein the first layer and a gate electrode of the thin-film transistor include a same material, and
 the second layer and a source electrode of the thin-film transistor include a same material.

7. The display apparatus of claim 4, wherein an upper surface of the first layer contacts a lower surface of the second layer.

8. The display apparatus of claim 4, wherein at least one insulating layer is between the first layer and the second layer, and
 the at least one insulating layer has at least one contact hole connecting the first layer with the second layer.

9. The display apparatus of claim 1, wherein the blocking layer extends along at least one edge of the substrate.

10. The display apparatus of claim 1, wherein a thermal conductivity of the blocking layer is greater than a thermal conductivity of the black matrix.

11. The display apparatus of claim 1, further comprising a quantum dot layer on the color filter layer.

* * * * *